(12) United States Patent
Wang et al.

(10) Patent No.: US 12,417,998 B2
(45) Date of Patent: Sep. 16, 2025

(54) PROCEDURE TO ENABLE DIE REWORK FOR HYBRID BONDING

(71) Applicant: Applied Materials, Inc., Santa Clara, CA (US)

(72) Inventors: Ying Wang, Singapore (SG); Guan Huei See, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 779 days.

(21) Appl. No.: 17/670,039

(22) Filed: Feb. 11, 2022

(65) Prior Publication Data

US 2023/0260955 A1    Aug. 17, 2023

(51) Int. Cl.
*H01L 23/00* (2006.01)
*H01L 21/66* (2006.01)

(52) U.S. Cl.
CPC .............. *H01L 24/80* (2013.01); *H01L 22/22* (2013.01); *H01L 2224/80004* (2013.01); *H01L 2224/80011* (2013.01); *H01L 2224/80048* (2013.01); *H01L 2224/80801* (2013.01); *H01L 2224/80896* (2013.01); *H01L 2224/80986* (2013.01)

(58) Field of Classification Search
CPC ...................... H01L 24/80; H01L 2224/80004; H01L 22/22
See application file for complete search history.

(56) References Cited

U.S. PATENT DOCUMENTS

| 8,293,578 B2 | 10/2012 | Bartley et al. |
| 10,297,686 B2 | 5/2019 | Or-Bach et al. |
| 2004/0175917 A1* | 9/2004 | Maeda ............... H01L 24/05 257/E23.021 |
| 2013/0285228 A1* | 10/2013 | Montez ............... H01L 23/10 438/106 |
| 2015/0137297 A1* | 5/2015 | Boettiger .......... H01L 27/14685 438/70 |
| 2015/0228822 A1 | 8/2015 | Koyanagi et al. |
| 2018/0182665 A1 | 6/2018 | Uzoh et al. |
| 2019/0252232 A1* | 8/2019 | Chen ................ H01L 21/67778 |
| 2020/0091110 A1 | 3/2020 | Shen et al. |
| 2020/0176437 A1 | 6/2020 | Wimplinger |
| 2021/0015011 A1* | 1/2021 | Chen ..................... H05K 3/303 |
| 2021/0110748 A1 | 4/2021 | Kim et al. |

FOREIGN PATENT DOCUMENTS

KR   10-2020-0060557 A   6/2020

OTHER PUBLICATIONS

International Search Report for Pct PCT/US2023/012806 dated June 5. 2023.

* cited by examiner

*Primary Examiner* — Tucker J Wright
(74) *Attorney, Agent, or Firm* — Moser Taboada

(57) ABSTRACT

Methods of bonding one or more dies to a substrate are provided herein. In some embodiments, a method of bonding one or more dies to a substrate includes: applying a material coating on the one or more dies or the substrate; placing the one or more dies on the substrate so that the one or more dies temporarily adhere to the substrate via surface tension or tackiness of the material coating; inspecting each of the one or more dies that are placed on the substrate for defects; and removing any of the one or more dies that are found to have defects.

16 Claims, 5 Drawing Sheets

PROCEDURE TO ENABLE DIE REWORK FOR HYBRID BONDING

FIELD

Embodiments of the present disclosure generally relate to substrate processing equipment.

BACKGROUND

Wafer bonding is a packaging technology on wafer-level for the fabrication of integrated circuits. Hybrid bonding is a type of wafer bonding technique where a bonding interface has two types of materials, such as a dielectric material and a metal material. Wafer to wafer (W2) hybrid bonding or chip to wafer (CoW) hybrid bonding are common hybrid bonding techniques. CoW hybrid bonding consists of bonding individual dies on the wafer. The basic flow for hybrid bonding generally consists of cleaning and activating of the bonding surfaces and then bringing the bonding surfaces together so that there is dielectric bonding between the dielectric materials. Subsequently, an annealing procedure may be performed to bond the metal materials and strengthen the dielectric bonding. However, any defects such as die misalignment or defective bonding found post bonding may be difficult to rework due to strong dielectric bonding strength and mechanical fragileness of thin dies. Die separation post bond is prone to die breakage and scattering of debris.

Accordingly, the inventors have provided improved procedures to enable die rework for hybrid bonding.

SUMMARY

Methods of bonding one or more dies to a substrate are provided herein. In some embodiments, a method of bonding one or more dies to a substrate includes: applying a material coating on the one or more dies or the substrate; placing the one or more dies on the substrate so that the one or more dies temporarily adhere to the substrate via surface tension or tackiness of the material coating; inspecting each of the one or more dies that are placed on the substrate for defects; and removing any of the one or more dies that are found to have defects.

In some embodiments, a non-transitory computer readable medium comprising one or more processors, that when executed, perform a method of bonding one or more dies on a substrate includes: applying a material coating on the one or more dies or the substrate; placing the one or more dies on the substrate so that the one or more dies temporarily adhere to the substrate via surface tension or tackiness of the material coating; inspecting each of the one or more dies that are placed on the substrate for defects; and removing any of the one or more dies that are found to have defects.

In some embodiments, a method of performing a chip-on-wafer (CoW) bonding process includes: applying a material coating on one or more dies or a substrate, wherein the material coating comprises a material that prevents dielectric bonding between the one or more dies and the substrate; placing the one or more dies on the substrate so that the one or more dies temporarily adhere to the substrate via surface tension or tackiness of the material coating; inspecting the one or more dies placed on the substrate for defects; removing any of the one or more dies that are found to have defects; replacing any of the one or more dies that are removed with a new, realigned, or recleaned die; and performing a post-bond anneal to dielectrically bond the one or more dies to the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
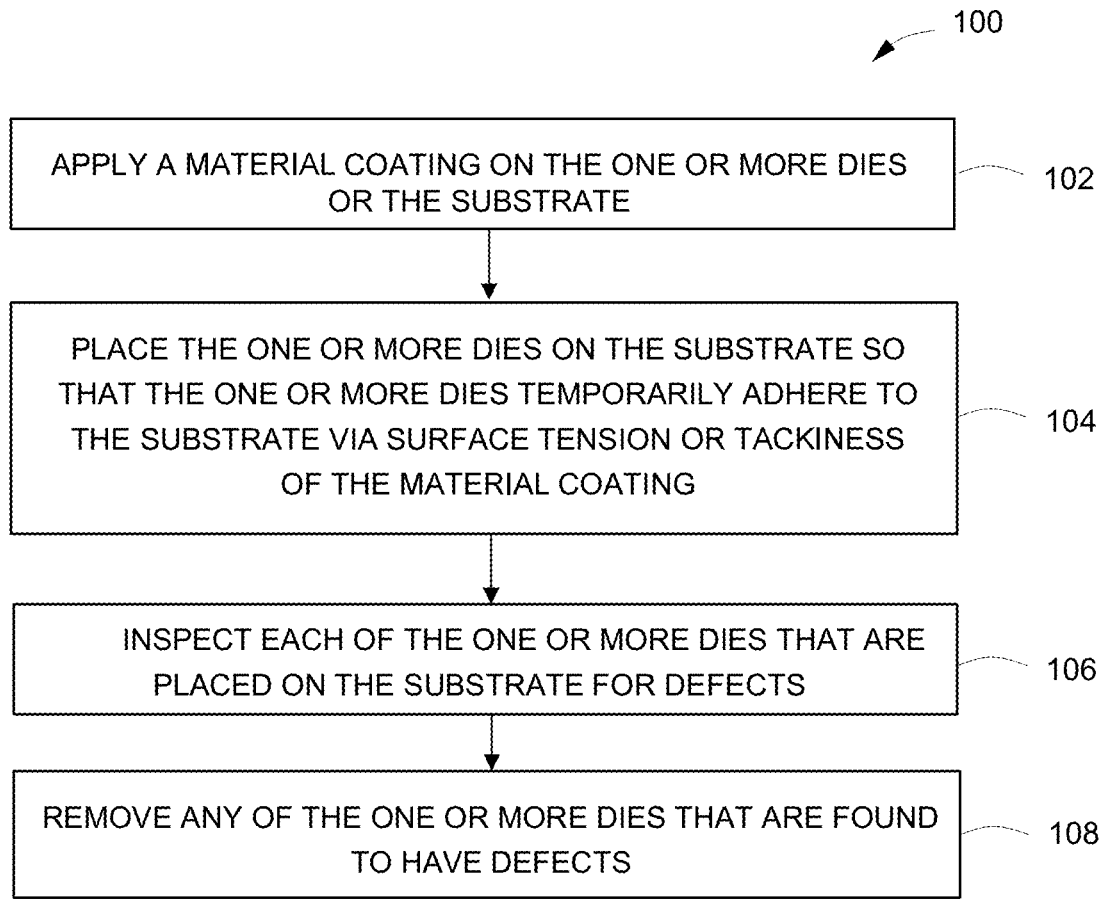
FIG. 1 depicts a flow chart of a method of bonding one or more dies to a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods of bonding one or more dies to a substrate to enable die rework for hybrid bonding are provided herein. In hybrid bonding, activated dielectric material on die and substrate sides are bonded together strongly upon contacting during pick-and-placing. The strong bonding helps holding the die to substrate firmly, but also makes bonding rework difficult in the case of die-to-wafer misalignment and/or defective bonding (particle-induced voids, delamination etc.). Die separation is particularly challenging, especially for thin die (e.g., 300 μm thick or less) due to the strong dielectric bonding strength and inherent mechanical fragileness of thin die. Die separation using conventional mechanical means is not suitable because of die breakage and scattering debris contamination of both substrate and bonder. The methods provided herein include a procedure that allows for temporarily weakening of the dielectric bonding strength between dies and the substrate for clean rework, and at the same time, allows for bonding strength restoration after a mild annealing in order to achieve high bonding yield.

Coating a substrate or dies that are activated with a layer of material coating to temporarily bond the dies to the substrate advantageously facilitates rework of dies having bond defects or misalignment. The material coating helps in preventing compromised activation/dehydration and further prevents the die from bonding strongly on the substrate upon die-substrate contact. The material coating also helps to temporality hold the die in place by surface tension or tackiness. Once any desired rework is complete, the material coating advantageously may readily evaporate and diffuse away from a bonding interface during a mild anneal process, promoting dielectric-to-dielectric bonding. Once the dielectric material on adjacent surfaces of the dies and substrate are bonded, the annealing temperature can be raised higher to promote metal bonding.

FIG. 1 depicts a flow chart of a method 100 of bonding one or more dies to a substrate in accordance with at least some embodiments of the present disclosure. In some embodiments, the method 100 is a chip-on-wafer (CoW) hybrid bonding process. At 102, the method 100 includes applying a material coating on the one or more dies or the substrate. In some embodiments, the material coating is a liquid coating. In some embodiments, the material coating is a solid coating of a thin layer of molecules applied, for example, via a deposition process such as an atomic layer deposition (ALD) process. In some embodiments, the material coating is a solid coating applied via a chemical treatment. For example, the substrate may be dip-coated with ammonium sulfide solution, which is immediately blown or rinsed off, leaving a thin layer of sulfur atoms adhering to and passivating the substrate. The thin layer of sulfur atoms is a solid layer which can diffuse away during a mild anneal process. In another example, a thiol chemical treatment may be applied to the substrate. The one or more dies may be singulated dies after plasma surface activation. The material coating is an additional material disposed along a bonding interface between the one or more dies and the substrate as compared to conventional or genuine CoW hybrid bonding processes. For example, a conventional or genuine CoW includes wet clean, degas, plasma, ultraviolet exposure treatments before the die to substrate bonding process.

The material coating may be any process-compatible material that prevents or substantially prevents dielectric bonding between the one or more dies and the substrate. In some embodiments, the material coating is a liquid coating that comprises an alcohol or a mixture of a few types of alcohols. In some embodiments, the material coating is a liquid coating that comprises a mixture of glycol and isopropyl alcohol. Isopropyl alcohol may reduce the viscosity and increase the flowability of glycol for abetting coating uniformity and having a smaller material layer thickness. In some embodiments, the material coating is a solid coating comprising a thin layer of sulfur or an organosulfur compound of the form R-SH, where R represents an alkyl or other organic substituent.

Figure 2A:
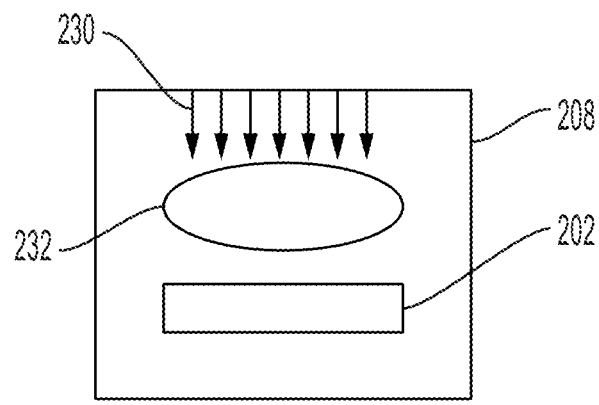
FIG. 2A depicts a schematic view of one or more dies or a substrate undergoing a pre-bond treatment in accordance with at least some embodiments of the present disclosure.
Figure 2B:
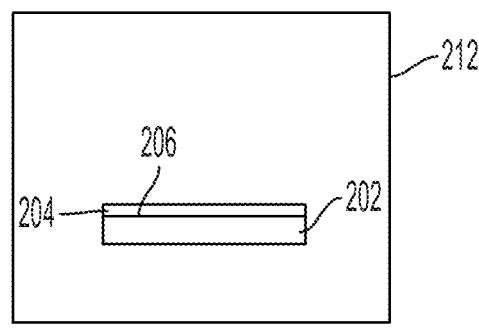
FIG. 2B depicts a schematic view of a substrate after a material coating treatment in accordance with at least some embodiments of the present disclosure

For example, FIG. 2B depicts a schematic view of a substrate 202 after a material coating 204 is applied to an upper surface 206 (e.g., activated surface) thereof in accordance with at least some embodiments of the present disclosure. In some embodiments, the material coating 204 may be applied to the one or more dies (e.g., one or more dies 210). The material coating 204 may be applied in a coating chamber 212. In some embodiments, the material coating 204 is applied via any suitable method such as spin coating, evaporating, sputtering, dipping, or spray coating. Accordingly, the coating chamber 212 may be a spin coating chamber, an evaporation chamber, a sputtering chamber, a dipping tank, or a chamber with a nozzle for spray coating. In some embodiments, the material coating 204 is about 1 to about 100 nanometers thick.

In some embodiments, the method 100 includes cleaning the substrate with a pre-bond treatment prior to applying the material coating (e.g., material coating 204) on the one or more dies 210 or the substrate 202. FIG. 2A depicts a schematic view of the substrate 202 undergoing a pre-bond treatment in accordance with at least some embodiments of the present disclosure. The pre-bond treatment is performed in a pre-bond chamber 208. In some embodiments, the pre-bond treatment is a wet clean process with cleaning fluid 230 directed at an activated surface of the substrate 202. In some embodiments, the pre-bond treatment is a plasma treatment via plasma 232 generated above the activated surface of the substrate 202.

Figure 2C:
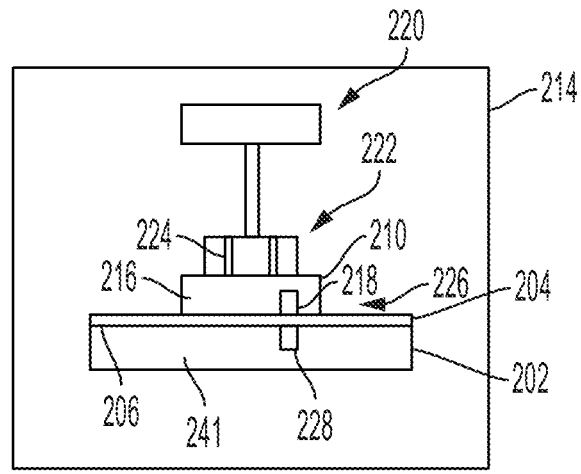
FIG. 2C depicts a schematic view of a die placed on a substrate having a material coating in accordance with at least some embodiments of the present disclosure.

At 104, the method 100 includes placing the one or more dies (e.g., one or more dies 210) on the substrate (e.g., substrate 202) so that the one or more dies temporarily adhere to the substrate via surface tension or tackiness of the material coating (e.g., material coating 204). The material coating 204 advantageously facilitates temporary bonding of the one or more dies 210 on the substrate 202 while at the same time preventing or substantially preventing dielectric bonding between the one or more dies 210 and the substrate 202. FIG. 2C depicts a schematic view of a die of the one or more dies 210 placed on a substrate 202 having a material coating 204 in accordance with at least some embodiments of the present disclosure. In some embodiments, the one or more dies 210 are placed on the substrate 202 in a bonder chamber 214. The bonder chamber 214 generally includes a tool 220 configured to eject, pick, flip, align, and place the one or more dies 210 onto the substrate 202. In some embodiments, the tool 220 includes a nozzle head 222 having one or more openings 224 for picking and placing the one or more dies 210 via vacuum suction applied to a backside of the one or more dies 210.

The one or more dies 210 are generally comprised of one or more metal pads 218 disposed in a body 216 made of a dielectric material, for example, silicon. The one or more metal pads 218 are disposed along a bonding interface 226 with the substrate 202. The substrate 202 includes one or more metal pads 228 disposed in a body 241 made of a dielectric material and corresponding with the locations of the one or more metal pads 218 of the dies. In some embodiments, the one or more metal pads 218, 228 may comprise copper, gold, silver, tin, or aluminum. For example, the one or more metal pads 218 may include copper, a copper alloy with trace amounts of other elements, or copper with a metal coating or plating at the bonding interface 226 comprising gold, silver, tin, aluminum, or the like.

In some embodiments, the body 216 of the one or more dies 210 includes a silicon oxide layer or a silicon nitride layer adjacent the bonding interface 226. In some embodiments, the silicon oxide layer or the silicon nitride layer are about 50 nanometers to about 1.2 micrometers thick. In some embodiments, the one or more metal pads 218 are disposed in the silicon oxide layer or the silicon nitride layer.

In some embodiments, the body 241 of the substrate 202 includes a silicon oxide layer or a silicon nitride layer adjacent the bonding interface 226. In some embodiments, the one or more metal pads 228 are disposed in the silicon oxide layer or the silicon nitride layer of the substrate 202. In some embodiments, the respective silicon oxide layer or the silicon nitride layer of the substrate 202 and the one or more dies 210 have a similar thickness.

At 106, the method 100 includes inspecting each of the one or more dies that are placed on the substrate for defects. In some embodiments, the defects include voids between a die and the substrate. For example, the voids may be between adjacent dielectric materials of the substrate and a die or adjacent metal materials of the substrate and a die. In some embodiments, voids that are greater than 1 micrometer may be deemed a defect. In some embodiments, defects include improper adhesion between a die and the substrate due to, for example, moisture or residue disposed along the bonding interface 226. In some embodiments, the defects may include misalignment of a die with respect to the substrate, for example, where the one or more metal pads 218, 228 don't align. In some embodiments, the defects may include delamination of a die from the substrate along an edge of a die/substrate interface.

Figure 2D:
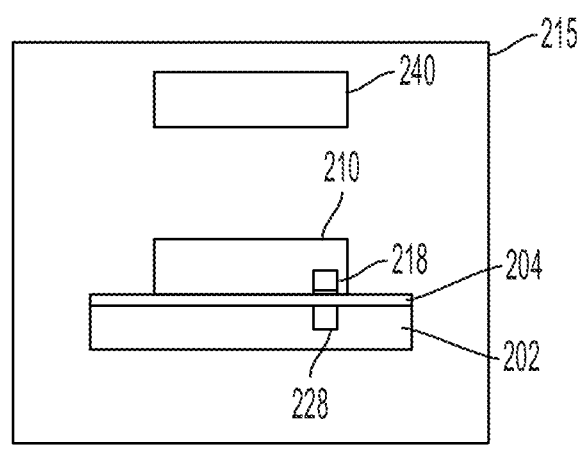
FIG. 2D depicts a schematic view of a die temporarily adhered to a substrate undergoing inspection for defects in accordance with at least some embodiments of the present disclosure.

In some embodiments, inspecting the one or more dies for defects comprises a die-by-die inspection, or in other words, after the placement of each die. In some embodiments, inspecting the one or more dies for defects comprises a substrate level inspection of multiple dies or all of the dies temporarily adhered to the substrate. FIG. 2D depicts a schematic view of a die of the one or more dies 210 temporarily adhered to a substrate 202 undergoing inspection for defects in accordance with at least some embodiments of the present disclosure. In some embodiments, the inspection is done in an inspection chamber 215. The inspection chamber 215 may include an inspection tool 240. The inspection tool 240 may utilize any type of metrology technique that can reveal the bonding quality of a subsurface bonded interface. For example, in some embodiments, the inspection tool 240 may be an optical tool configured to perform IR or near infrared metrology. In some embodiments, the inspection tool 240 may be an acoustic-based tool such as a scanning acoustic microscope. In some embodiments, the inspection chamber 215 is a standalone chamber. In some embodiments, the inspection chamber 215 is integrated with the bonder chamber 214.

Figure 2E:
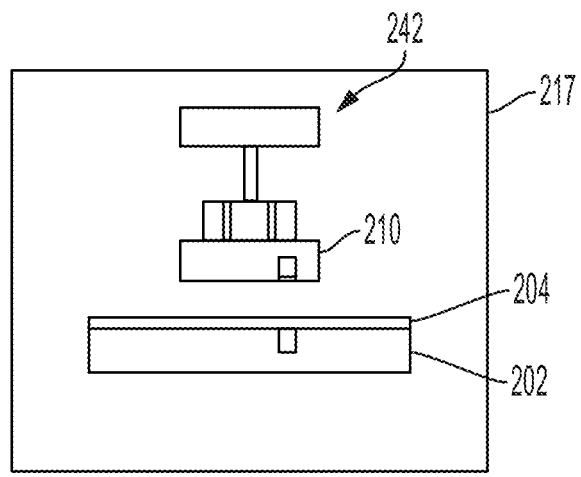
FIG. 2E depicts a schematic view of a die detachment chamber for detaching dies from a substrate in accordance with at least some embodiments of the present disclosure

At 108, the method 100 includes removing any of the one or more dies that are found to have defects, such as the defects discussed above. In some embodiments, removing the one or more dies is performed via vacuum suction, contactless picking, or mechanical scraping. For example, FIG. 2E depicts a schematic view of a die detachment chamber 217 for detaching dies from a substrate in accordance with at least some embodiments of the present disclosure. A picker tool 242 may apply vacuum suction on a backside of the one or more dies 210 from the substrate. In some embodiments, contactless picking may consist of picking via acoustic beams or waves. The temporary adhesion of the one or more dies 210 to the substrate 202 via the material coating 204 facilitates easy removal of dies found to have defects. In some embodiments, the picker tool 242 may be similar to or the same as the tool 220. In some embodiments, the die detachment chamber 217 is a standalone chamber. In some embodiments, the bonder chamber 214 is also the die detachment chamber 217.

In some embodiments, the method 100 includes replacing any of the one or more dies that are removed with a new, realigned, or recleaned die. The die replacement procedure may be similar to any of the die placement procedures discuss above. In some embodiments, the die replacement procedure may be performed in a standalone chamber. In some embodiments, the die replacement procedure may be performed in the bonder chamber 214 or another bonder chamber different than the bonder chamber 214.

In some embodiments, the method 100 includes inspecting the new, realigned, or recleaned die that is replaced for defects. The replaced die inspection procedure may be similar to the die inspection procedures discuss above. In some embodiments, the replaced die inspection procedure may be performed in a standalone chamber. In some embodiments, the replaced die inspection procedure may be performed in the inspection chamber 215 or another inspection chamber different than the inspection chamber 215.

In some embodiments, the method 100 includes performing a mild annealing process to remove the material coating and promote dielectric bonding between adjacent dielectric surfaces of the one or more dies and the substrate. The mild anneal may be performed at a first temperature around or slightly lower than the boiling point of the material coating 204 so that the process does not cause a rapid evaporation/boiling of the material coating 204. Such rapid evaporation/boiling can undesirably generate vapor at the bonding interface that pushes/displaces/moves the dies and compromises alignment between the die and substrate. In some embodiments, around may be within 10 percent. In some embodiments, the mild annealing process is performed at about 150 to about 250 degrees Celsius for about 90 to about 150 minutes. In some embodiments, the anneal chamber 250 can be evacuated/pumped down to facilitate out-diffusion of the material coating 204. In some embodiments, the mild annealing process removes the material coating, but may not be hot enough to adequately bond adjacent metal surfaces of the one or more dies and the substrate.

Figure 2F:
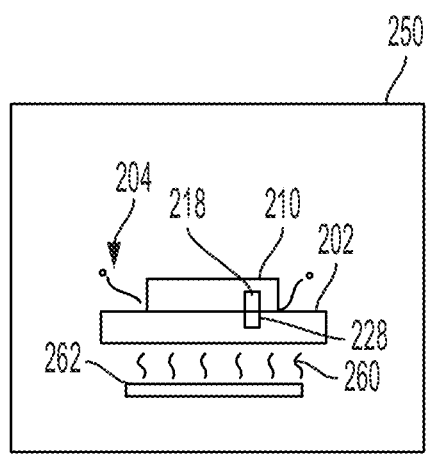
FIG. 2F depicts a schematic view of a die placed on a substrate undergoing a mild anneal process to remove the material coating in accordance with at least some embodiments of the present disclosure.

FIG. 2F depicts a schematic view of an anneal chamber 250 showing a die of the one or more dies 210 placed on a substrate 202 after undergoing a mild anneal process to remove the material coating 204 in accordance with at least some embodiments of the present disclosure. The anneal chamber 250, for example, may be a furnace, an oven, a baking station, or the like. In some embodiments, heat 260 provided by a heating element 262 of the anneal chamber 250 evaporates the material coating 204. In some embodiments, the anneal chamber 250 is a standalone chamber.

In some embodiments, the method 100 includes performing a post-bond anneal to promote metal bonding between adjacent metal surfaces of the one or more dies and the substrate. In some embodiments, the mild annealing process is performed prior to performing the post-bond anneal to remove the material coating and promote dielectric bonding between the one or more dies and the substrate, while the post-bond anneal is performed to promote metal bonding between adjacent metal surfaces of the one or more dies and the substrate. In some embodiments, the adjacent metal surfaces comprise at least one of copper, gold, silver, tin, or aluminum. In some embodiments, the post-bond anneal is performed at a second temperature higher than the first temperature but lower than about 400 degrees Celsius. In some embodiments, the post-bond anneal is performed at a temperature of about 200 to about 400 degrees Celsius. In some embodiments, the post-bond anneal is performed to remove the material coating and promote dielectric bonding without performing the mild annealing prior to the post-bond anneal. The post-bond anneal may be performed in-situ after the mild anneal process. In some embodiments, the post-bond anneal may be performed in a separate chamber or a separate processing tool than the mild anneal process.

Figure 2G:
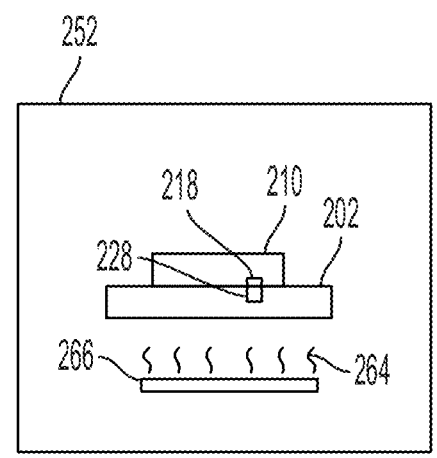
FIG. 2G depicts a schematic view of a die place on a substrate undergoing a post-bond anneal process in accordance with at least some embodiments of the present disclosure.

FIG. 2G depicts a schematic view of a die place on a substrate 202 undergoing a post-bond anneal process in an anneal chamber 252 in accordance with at least some embodiments of the present disclosure. The anneal chamber 252, for example, may be a furnace, an oven, a baking station, or the like. In some embodiments, heat 264 provided by a heating element 266 of the anneal chamber 252 is configured to promote metal bonding. In some embodiments, the anneal chamber 252 is a standalone chamber. In some embodiments, the anneal chamber 252 is the anneal chamber 250 such that the mild annealing and the post-pond anneal processes are performed in the same chamber.

Figure 3:
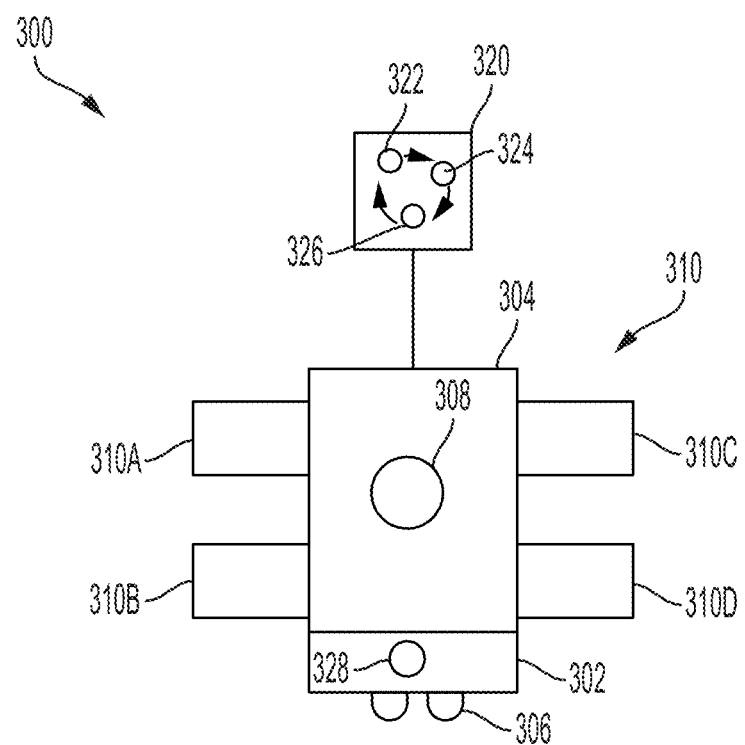
FIG. 3 depicts a multi-chamber processing tool in accordance with at least some embodiments of the present disclosure.

One or more of the processes described herein may be performed in a multi-chamber processing tool. For example, in some embodiments, all processes described herein may be performed in the multi-chamber processing tool. In some embodiments, all processes except for the post-bond anneal may be performed in the multi-chamber processing tool, with the post-bond anneal performed in a stand-alone tool. FIG. 3 depicts a multi-chamber processing tool 300 in accordance with at least some embodiments of the present disclosure. The multi-chamber processing tool 300 may be configured for bonding one or more dies 210 to a substrate 202. The multi-chamber process tool 300 generally includes a factory interface (FI) 302 having one or more loadports 306 for loading substrates into the multi-chamber process tool 300. The substrates may include 200 mm wafers, 300 mm wafers, 450 mm wafers, carrier substrates, silicon substrates, glass substrates, tape frame substrates that have one or more dies adhered thereto (e.g., one or more dies 210), or the like. The FI 302 may include a FI robot 328 for transferring substrates from the one or more loadports 306 to a transfer chamber 304.

One or more process chambers 310 may be sealingly engaged with the transfer chamber 304 to perform the processes described herein. As depicted in FIG. 3, process chambers 310A-D are coupled to the transfer chamber 304. A transfer robot 308 is generally housed in the transfer chamber 304 and configured to transport substrates between the FI 302 and the one or more process chambers 310 and between process chambers 310A-D.

The one or more process chambers 310 may include atmospheric chambers that are configured to operate under atmospheric pressure and vacuum chambers that are configured to operate under vacuum pressure. Examples of the atmospheric chambers may generally include wet clean chambers, anneal chambers, metrology chambers, bonding chambers, or the like. Examples of vacuum chambers may include plasma chambers. The one or more process chambers 310 may be any process chambers or modules needed to perform a bonding process, a cleaning process, an inspection process, or the like. For example, process chamber 310A may be the pre-bond chamber 208, process chamber 310B may be the coating chamber 212, process chamber 310C may be the bonder chamber 214, and process chamber 310D may be the anneal chamber 250. In such embodiments, the bonder chamber 214 may also be the inspection chamber 215. In some embodiments, die placement, die inspection, die removal, die replacement, and replaced die inspection may be completed in the bonder chamber 214. In some embodiments, die placement, die inspection, die removal, die replacement, and replaced die inspection may be completed in two or more separate process chambers.

The multi-chamber processing tool 300 may include a controller 320 that controls the operation thereof. The controller 320 can control the multi-chamber processing tool 300 directly, or alternatively, indirectly by controlling the computers (or controllers) associated with the multi-chamber processing tool 300. In operation, the controller 320 enables data collection and feedback from the multi-chamber processing tool 300 to optimize performance of the multi-chamber processing tool 300. The controller 320 generally includes a central processing unit (CPU) 322 comprising one or more processors, a memory 324, and a support circuit 326. The CPU 322 may be any form of a general-purpose computer processor that can be used in an industrial setting. The support circuit 326 is conventionally coupled to the CPU 322 and may comprise a cache, clock circuits, input/output subsystems, power supplies, and the like. Software routines, such as a method as described herein may be stored in the memory 324 and, when executed by the CPU 322, transform the CPU 322 into a specific purpose computer (controller 320). The software routines may also be stored and/or executed by a second controller (not shown) that is located remotely from the multi-chamber processing tool 300.

The memory 324 may be in the form of a non-transitory computer-readable storage media that contains instructions, when executed by the CPU 322, to facilitate the operation of multi-chamber processing tool 300. The instructions in the memory 324 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

While the foregoing is directed to embodiments of the present disclosure, other and further embodiments of the disclosure may be devised without departing from the basic scope thereof.

The invention claimed is:

1. A method of bonding one or more dies to a substrate, comprising:
    applying a material coating on the one or more dies or the substrate;
    placing the one or more dies on the substrate so that the one or more dies temporarily adhere to the substrate via surface tension or tackiness of the material coating;
    inspecting each of the one or more dies that are placed on the substrate for defects;
    removing any of the one or more dies that are found to have defects; and at least one of:
    performing a mild annealing process at a first temperature around or slightly lower than the boiling point of the coated material to remove the material coating and promote dielectric bonding between adjacent dielectric surfaces of the one or more dies and the substrate, or wherein the material coating comprises a mixture of glycol and isopropyl alcohol.

2. The method of claim 1, further comprising replacing any of the one or more dies that are removed with a new, realigned, or recleaned die.

3. The method of claim 2, further comprising inspecting the new, realigned, or recleaned die for defects after replacement.

4. The method of claim 1, further comprising performing a post-bond anneal at a second temperature higher than the first temperature but lower than about 400 degrees Celsius to promote metal bonding between adjacent metal surfaces of the one or more dies and the substrate, wherein the adjacent metal surfaces comprise at least one of copper, gold, silver, tin, or aluminum.

5. The method of claim 1, wherein removing the one or more dies is performed via vacuum suction, contactless picking, or mechanical scraping.

6. The method of claim 1, wherein the defects include voids between each die and the substrate, improper adhesion between each die and the substrate, misalignment of each die with respect to the substrate, or delamination of each die and the substrate.

7. The method of claim 1, wherein at least one of:
the material coating is about 1 to about 100 nanometers thick;
the material coating is a liquid coating applied via spin coating, evaporating, or spray coating; or
the material coating is a solid coating.

8. The method of claim 1, further comprising cleaning the substrate with a wet clean process prior to applying the material coating on at least one of the one or more dies and the substrate.

9. The method of claim 1, wherein inspecting the one or more dies for defects comprises die by die inspection.

10. The method of claim 1, wherein inspecting the one or more dies for defects comprises a substrate level inspection of all of the one or more dies temporarily adhered to the substrate.

11. A non-transitory computer readable medium that contains instructions that, when executed by one or more processors, perform a method of bonding one or more dies on a substrate, comprising:
applying a material coating on the one or more dies or the substrate;
placing the one or more dies on the substrate so that the one or more dies temporarily adhere to the substrate via surface tension or tackiness of the material coating;
inspecting each of the one or more dies that are placed on the substrate for defects;
removing any of the one or more dies that are found to have defects; and at least one of:
performing a mild annealing process at a first temperature around or slightly lower than the boiling point of the coated material to remove the material coating and promote dielectric bonding between adjacent dielectric surfaces of the one or more dies and the substrate, or
wherein the material coating comprises a mixture of glycol and isopropyl alcohol.

12. The non-transitory computer readable medium of claim 11, further comprising performing a mild annealing process to remove the material coating and promote dielectric bonding between the one or more dies and the substrate.

13. A method of performing a chip-on-wafer (CoW) bonding process, comprising:
applying a material coating on one or more dies or a substrate, wherein the material coating comprises a material that prevents dielectric bonding between the one or more dies and the substrate;
placing the one or more dies on the substrate so that the one or more dies temporarily adhere to the substrate via surface tension or tackiness of the material coating;
inspecting the one or more dies placed on the substrate for defects;
removing any of the one or more dies that are found to have defects;
replacing any of the one or more dies that are removed with a new, realigned, or recleaned die;
performing an anneal process to remove the material coating and to bond the one or more dies to the substrate; and wherein at least one of:
the anneal process comprises: performing a mild annealing process to remove the material coating and promote dielectric bonding between adjacent dielectric surfaces of the one or more dies and the substrate, and performing a post-bond anneal to promote metal bonding between adjacent metal surfaces of the one or more dies and the substrate; or
the material coating comprises a mixture of glycol and isopropyl alcohol.

14. The method of claim 13, wherein the mild annealing process is performed at about 150 to about 250 degrees Celsius for about 90 to about 150 minutes.

15. The method of claim 13, wherein the method is performed in-situ via a multi-chamber processing tool.

16. The method of claim 13, wherein the post-bond anneal is performed at a temperature of about 200 to about 400 degrees Celsius.

* * * * *